US006691567B2

(12) United States Patent
Walker et al.

(10) Patent No.: US 6,691,567 B2
(45) Date of Patent: Feb. 17, 2004

(54) SYSTEM AND METHOD FOR TIRE PRESSURE MONITORING INCLUDING AUTOMATIC TIRE LOCATION RECOGNITION

(75) Inventors: Keith Walker, Redford, MI (US); John S. Nantz, Brighton, MI (US); Thomas Bejster, Dearborn, MI (US); Bruce Conner, Ann Arbor, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/157,650

(22) Filed: May 29, 2002

(65) Prior Publication Data
US 2003/0164030 A1 Sep. 4, 2003

Related U.S. Application Data
(60) Provisional application No. 60/360,762, filed on Mar. 1, 2002.

(51) Int. Cl.⁷ ................... G01M 17/02; B60C 23/02
(52) U.S. Cl. ................. 73/146; 73/146.2; 73/146.8; 340/447; 340/448
(58) Field of Search .................. 73/146–146.8; 340/442, 447, 445, 444, 448, 626

(56) References Cited
U.S. PATENT DOCUMENTS

| 3,580,353 | A |   | 5/1971  | Thompson |
|-----------|---|---|---------|----------|
| 3,916,688 | A |   | 11/1975 | Dendy et al. |
| 4,067,235 | A |   | 1/1978  | Markland et al. |
| 4,101,870 | A |   | 7/1978  | Ekman |
| 4,330,774 | A |   | 5/1982  | Doty |
| 4,450,431 | A |   | 5/1984  | Hochstein |
| 4,468,650 | A |   | 8/1984  | Barbee |
| 4,570,152 | A | * | 2/1986  | Melton et al. ............ 340/58 |
| 4,660,528 | A |   | 4/1987  | Buck |
| 4,670,845 | A |   | 6/1987  | Etoh |
| 4,717,905 | A |   | 1/1988  | Morrison, Jr. et al. |
| 4,749,993 | A |   | 6/1988  | Szabo et al. |
| 4,951,208 | A |   | 8/1990  | Etoh |
| 5,040,561 | A |   | 8/1991  | Achterholt |
| 5,109,213 | A |   | 4/1992  | Williams |
| 5,156,230 | A |   | 10/1992 | Washburn |
| 5,165,497 | A |   | 11/1992 | Chi |
| 5,289,160 | A |   | 2/1994  | Fiorletta |
| 5,444,448 | A |   | 8/1995  | Schuermann et al. |
| 5,451,959 | A |   | 9/1995  | Schuermann |
| 5,461,385 | A |   | 10/1995 | Armstrong |
| 5,463,374 | A |   | 10/1995 | Mendez et al. |
| 5,473,938 | A |   | 12/1995 | Handfield et al. |
| 5,479,171 | A |   | 12/1995 | Schuermann |
| 5,483,827 | A |   | 1/1996  | Kulka et al. |
| 5,485,381 | A |   | 1/1996  | Heintz et al. |
| 5,500,637 | A |   | 3/1996  | Kokubu |
| 5,562,787 | A |   | 10/1996 | Koch et al. |
| 5,573,610 | A |   | 11/1996 | Koch et al. |
| 5,573,611 | A |   | 11/1996 | Koch et al. |

(List continued on next page.)

Primary Examiner—Andrew H. Hirshfeld
Assistant Examiner—Marrissa Ferguson
(74) Attorney, Agent, or Firm—Bill C. Panagos

(57) ABSTRACT

In a system for remote monitoring of vehicle tire pressure, a system and method for automatically identifying tire location. A tire pressure monitor mounted in each tire includes a sensor for sensing tire pressure, a transmitter for transmitting a signal representative of the sensed tire pressure, and a magnetic switch for actuating the transmitter. An electromagnets is mounted on the vehicle in proximity to each tire location and generates a magnetic field causing the magnetic switch to actuate the transmitter of the associated tire pressure monitor. A controller mounted on the vehicle is provided in communication with the electromagnets, processes the tire pressure signals from the transmitters, and conveys tire pressure and location information to a user. The controller energizes the electromagnets so that each received tire pressure signal is automatically associated with a specific tire location.

20 Claims, 2 Drawing Sheets

U.S. PATENT DOCUMENTS

| | | |
|---|---|---|
| 5,585,554 A | 12/1996 | Handfield et al. |
| 5,600,301 A | 2/1997 | Robinson, III |
| 5,602,524 A | 2/1997 | Mock et al. |
| 5,654,689 A | 8/1997 | Peyre et al. |
| 5,661,651 A | 8/1997 | Geschke et al. |
| 5,677,667 A | 10/1997 | Lesesky et al. |
| 5,705,746 A | 1/1998 | Trost et al. |
| 5,717,376 A | 2/1998 | Wilson |
| 5,724,028 A | 3/1998 | Prokup |
| 5,728,933 A | 3/1998 | Schultz et al. |
| 5,740,548 A | 4/1998 | Hudgens |
| 5,741,966 A | 4/1998 | Handfield et al. |
| 5,753,809 A | 5/1998 | Ogusu et al. |
| 5,760,682 A | 6/1998 | Liu et al. |
| 5,774,047 A | 6/1998 | Hensel, IV |
| 5,783,992 A | 7/1998 | Eberwine et al. |
| 5,822,683 A | 10/1998 | Paschen |
| 5,835,868 A | 11/1998 | McElroy et al. |
| 5,838,229 A | 11/1998 | Robinson, III |
| 5,844,130 A | 12/1998 | Hilgart et al. |
| 5,853,020 A | 12/1998 | Widner |
| 5,880,363 A | 3/1999 | Meyer et al. |
| 5,900,808 A | 5/1999 | Lebo |
| 5,926,087 A | 7/1999 | Busch et al. |
| 5,939,977 A | 8/1999 | Monson |
| 5,942,971 A | 8/1999 | Fauci et al. |
| 5,959,365 A | 9/1999 | Mantini et al. |
| 5,963,128 A | 10/1999 | McClelland |
| 5,999,091 A | 12/1999 | Wortham |
| 6,002,327 A | 12/1999 | Boesch et al. |
| 6,025,777 A | 2/2000 | Fuller et al. |
| 6,034,596 A | 3/2000 | Smith et al. |
| 6,034,597 A | 3/2000 | Normann et al. |
| 6,043,738 A | 3/2000 | Stewart et al. |
| 6,043,752 A | 3/2000 | Hisada et al. |
| 6,053,038 A | 4/2000 | Schramm et al. |
| 6,060,984 A | 5/2000 | Braun et al. |
| 6,087,930 A | 7/2000 | Kulka et al. |
| 6,111,520 A | 8/2000 | Allen et al. |
| 6,112,587 A | 9/2000 | Oldenettel |
| 6,118,369 A | 9/2000 | Boesch |
| 6,127,939 A | 10/2000 | Lesesky et al. |
| 6,169,480 B1 | 1/2001 | Uhl et al. |
| 6,175,302 B1 | 1/2001 | Huang |
| 6,181,241 B1 | 1/2001 | Normann et al. |
| 6,204,758 B1 | 3/2001 | Wacker et al. |
| 6,232,875 B1 | 5/2001 | DeZorzi |
| 6,232,884 B1 | 5/2001 | Gabbard |
| 6,243,007 B1 | 6/2001 | McLaughlin et al. |
| 6,246,317 B1 | 6/2001 | Pickornik et al. |
| 6,252,498 B1 | 6/2001 | Pashayan, Jr. |
| 6,255,940 B1 | 7/2001 | Phelan et al. |
| 6,259,361 B1 | 7/2001 | Robillard et al. |
| 6,259,362 B1 | 7/2001 | Lin |
| 6,275,148 B1 | 8/2001 | Takamura et al. |
| 6,278,363 B1 | 8/2001 | Bezek et al. |
| 6,304,610 B1 | 10/2001 | Monson |
| 6,340,929 B1 | 1/2002 | Katou et al. |
| 6,417,766 B1 * | 7/2002 | Starkey ..................... 340/447 |
| 2001/0008083 A1 | 7/2001 | Brown |

* cited by examiner

SYSTEM AND METHOD FOR TIRE PRESSURE MONITORING INCLUDING AUTOMATIC TIRE LOCATION RECOGNITION

CROSS REFERENCE TO RELATED APPLICATION

This application claims the benefit of U.S. provisional application Ser. No. 60/360,762, filed Mar. 1, 2002.

BACKGROUND OF THE INVENTION

1. Field of the Invention

The present invention relates generally to wireless vehicle tire pressure monitoring and, more particularly, to a system and method for wireless vehicle tire pressure monitoring that provide for automatic recognition of tire location.

2. Background

It is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display.

Exemplary tire pressure monitoring systems are described and shown in U.S. Pat. Nos. 6,112,587 and 6,034,597. To recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, in order to provide a vehicle operator with information specific to each vehicle tire, programming of the tire pressure monitoring system must be undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

Such operation, however, can create problems when tires are subsequently rotated or changed from their initial locations to new locations, or a vehicle tire is replaced. Each time the vehicle tires are rotated or a tire is replaced, initialization or sign-up must be repeated to ensure that the system continues to operate properly by conveying accurate information, including tire location, to the vehicle operator. This initialization requirement makes tire rotation more complex, and increases the possibility of inaccurate operation of the system. Moreover, in the event the magnet for activating the reed switches is misplaced or lost, the tire pressure monitoring system cannot be properly programmed after tire rotation.

Thus, there exists a need for an improved system and method for identifying tire locations in a tire pressure monitoring system. Such a system and method would automatically recognizes tire location even after tire rotation, without the need for subsequent initialization or sign-up operations. Such a system and method would also do so easily and simply, without adding significant costs to the tire pressure monitoring system.

SUMMARY OF THE INVENTION

Accordingly, the present invention provides an improved system and method for vehicle tire pressure monitoring that provide for automatic recognition of tire location.

According to the present invention, then, in a system for remote monitoring of tire pressure in a vehicle having a plurality of tires, each tire having a location, a system is provided for automatically identifying tire location. The system comprises a plurality of tire monitors, each monitor for mounting in one of the plurality of tires, each monitor comprising a sensor for sensing tire pressure, a transmitter for transmitting a signal representative of the sensed tire pressure, and a magnetic switch for actuating the transmitter to transmit a tire pressure signal. The system further comprises a plurality of electromagnets, each electromagnet for mounting on-board the vehicle in proximity to one of the plurality of tire locations for association with one of the plurality of tire monitors, each electromagnet for generating a magnetic field causing the magnetic switch of the associated tire monitor to actuate the transmitter of the associated tire monitor to transmit a tire pressure signal. The system still further comprises a receiver for mounting on-board the vehicle for receiving the tire pressure signals transmitted by the transmitters, and a controller for mounting on-board the vehicle, the controller to be provided in communication with the plurality of electromagnets and the receiver, the controller for processing tire pressure signals received by the receiver and for use in conveying tire pressure and location information to a user. The controller energizes the plurality of electromagnets so that each received tire pressure signal is automatically associated with one of the plurality of tire locations.

Also according to the present invention, in a system for remote monitoring of tire pressure in a vehicle having a plurality of tires, each tire having a location, a method is provided for automatically identifying tire location. The method comprises providing a plurality of tire monitors, each monitor for mounting in one of the plurality of tires, each monitor comprising a sensor for sensing tire pressure, a transmitter for transmitting a signal representative of the sensed tire pressure, and a magnetic switch for actuating the transmitter to transmit a tire pressure signal. The method further comprises providing a plurality of electromagnets, each electromagnet for mounting on-board the vehicle in proximity to one of the plurality of tire locations for association with one of the plurality of tire monitors, each electromagnet for generating a magnetic field causing the magnetic switch of the associated tire monitor to actuate the transmitter of the associated tire monitor to transmit a tire pressure signal. The method still further comprises providing a controller for mounting on-board the vehicle, the controller to be provided in communication with the plurality of electromagnets, the controller for processing tire pressure signals received from the transmitters for use in conveying tire pressure and location information to a user. The controller energizes the plurality of electromagnets so that each received tire pressure signal is automatically associated with one of the plurality of tire locations.

These and other features and advantages of the present invention will be readily apparent upon consideration of the following detailed description of the invention in conjunction with the accompanying drawings.

DETAILED DESCRIPTION OF THE PREFERRED EMBODIMENT(S)

Figure 1:
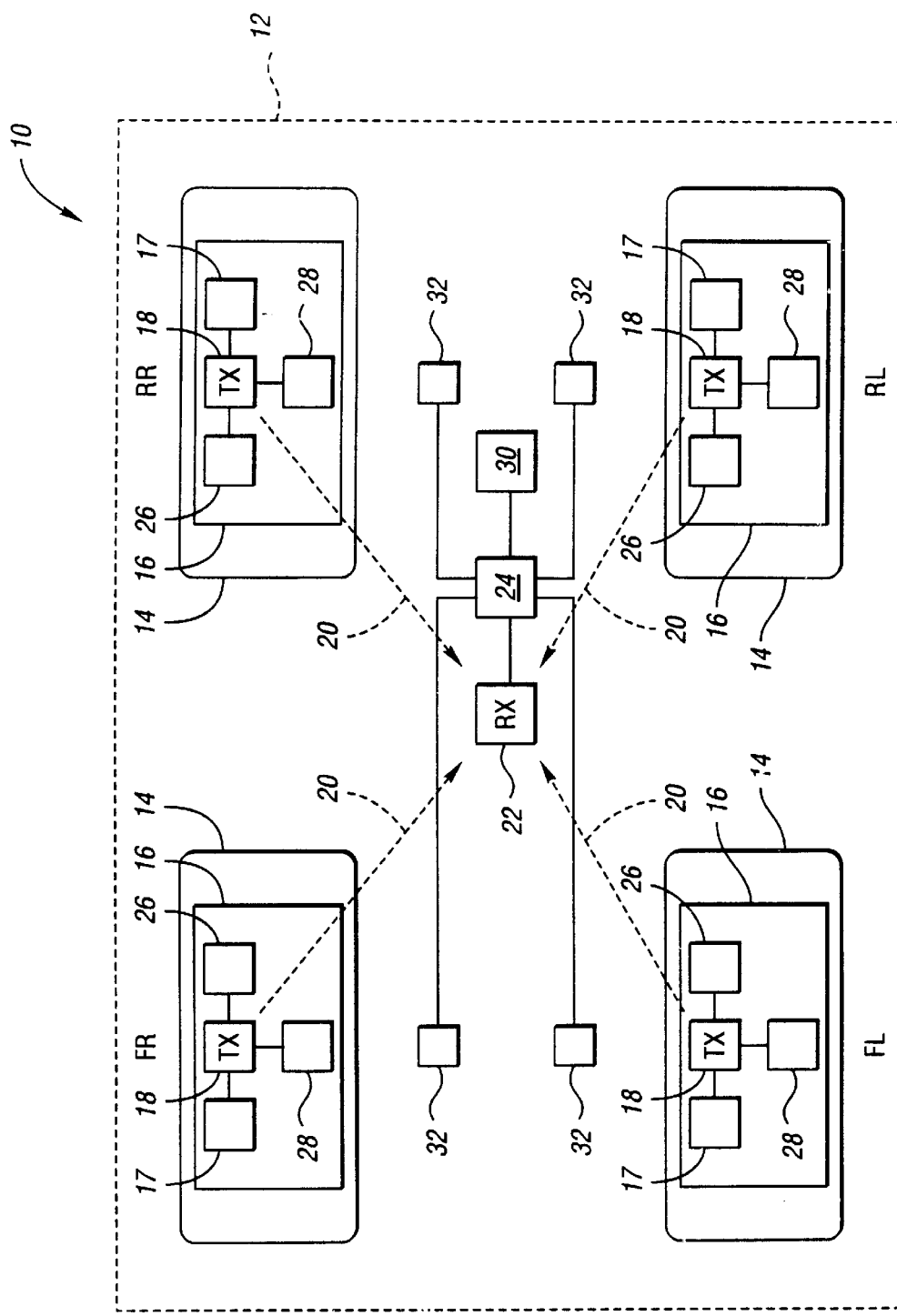
FIG. 1 is a simplified, representative block diagram of the system of the present invention for automatically identifying tire location in a tire pressure monitoring system.

Referring now to the Figures, the preferred embodiments of the present invention will now be described in detail. As previously noted, it is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display.

As also previously noted, in order to recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, to provide a vehicle operator with information specific to each vehicle tire, programming of the tire pressure monitoring system must be undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

As noted previously, however, such operation can create problems when tires are subsequently rotated or changed from their initial locations to new locations, or when a tire is replaced. Each time the vehicle tires are rotated or a tire is replaced, initialization or sign-up must be repeated to ensure that the system continues to operate properly by conveying accurate information, including tire location, to the vehicle operator. This initialization requirement makes tire rotation more complex, and increases the possibility of inaccurate operation of the system. Moreover, in the event the magnet for activating the reed switches is misplaced or lost, the tire pressure monitoring system cannot be properly programmed after tire rotation.

Thus, as noted above, there exists a need for an improved system and method for identifying tire locations in a tire pressure monitoring system. Such a system and method would automatically recognizes tire location even after tire rotation, without the need for subsequent initialization or sign-up operations. Such a system and method would also do so easily and simply, without adding significant costs to the tire pressure monitoring system.

Referring now to FIG. 1, a simplified, representative block diagram of the system of the present invention for automatically identifying tire location in a tire pressure monitoring system is shown, denoted generally by reference numeral 10. As seen therein, the system (10) is designed for use in a vehicle (12) having a plurality of tires (14). Each one of the plurality of tires (14) has a tire location associated therewith, such as front left (FL), front right (FR), rear left (RL), and rear right (RR). It should be noted here that while the present invention is described herein for use in an automotive vehicle having four tires, such an environment is exemplary only. That is, the present invention is suitable for use in any type of vehicle having any number of tires.

Still referring to FIG. 1, the system (10) includes a plurality of tire monitors (16). Each tire monitor (16) is provided for mounting in one of the plurality of tires (14). In that regard, each tire monitor (16) is preferably located inside the tire (14) adjacent the tire inflation valve stem (not shown), although any mounting location known in the art may be used. Each tire monitor (16) includes an appropriate sensor (17) and/or other devices (not shown), for sensing, determining and/or monitoring at least the pressure of the associated tire (14). It should be noted, however, that each tire monitor (16) may also be equipped to sense, determine and/or monitor any number of tire parameters in addition to pressure including, but not limited to, temperature, status (i.e., whether or not the tire is rotating) and/or speed, in any fashion well known to those of ordinary skill in the art.

Each tire monitor (16) also includes a transmitter (18) in communication with sensor (17) for transmitting a tire pressure signal (20) representative of the sensed tire pressure. In that regard, tire pressure signal (20) is preferably a radio frequency (RF) signal, although other signal types known in the art could be employed. Once again, it should be noted that transmitter (18) may also transmit, as part of or separate from tire pressure signal (20), a signal or signals representative of information concerning any of a number of other tire parameters in addition to pressure such as temperature, status and/or speed as sensed, measured and/or determined by an appropriately equipped tire monitor (16). It should also be noted that each tire monitor (16) typically includes a battery (not shown), and that transmitter (18) may also transmit, again as part of or separate from tire pressure signal (20), a signal or signals representative of the status of such a battery, including a low batter status, which information may also be conveyed to a vehicle occupant. As will be described in greater detail below, such tire pressure information, together with information concerning any other tire and/or battery parameters, is ultimately conveyed to a vehicle operator, typically via a visual display, although audible means such as tones or speech may also be used.

Referring still to FIG. 1, the tire pressure monitoring system (10) of the present invention also includes a receiver

(22) for mounting on-board the vehicle (12) for receiving the tire pressure signals (20) transmitted by transmitters (18). Receiver (22) comprises one or more antenna (not shown) to be located at one or more selected sites on the vehicle (12).

Still referring to FIG. 1, the system (10) of the present invention further comprises a controller (24) for mounting on-board vehicle (12) and to be provided in communication with receiver (22). Controller (24) is for processing tire pressure signals (20) received by receiver (22) from transmitters (18) for use in automatically identifying the tire location associated with each tire pressure signal (20). Controller (24) is also for generating control signals (not shown) for use in conveying at least tire pressure and tire location information to a vehicle operator, typically via a display unit (30), such as an LED display or a lighted icon in the vehicle dashboard or a vehicle console. Once again, as described above, information concerning other tire parameters, such as temperature, status and/or speed, or battery status, may also be conveyed to the vehicle operator. It should be noted that the information may also be conveyed to the vehicle operator in an audible fashion, and may include a warning, which may also be audible, if tire pressure, other tire parameters, such as temperature, and/or battery status are outside recommended ranges.

Referring still to FIG. 1, each pressure sensor (17) and/or transmitter (18) preferably has a unique identification code associated therewith. Such identification codes serve to particularly associate sensors (17) and/or transmitters (18) with vehicle (12). As a result, as described in greater detail below, such identification codes can facilitate confirming or verifying tire location information. In that regard, each transmitter (18) also preferably transmits such identification code for receipt by receiver (22) and for use by controller (24) in verifying that the tire pressure signals (20) received by receiver (22) are associated with the vehicle (12). Transmitters (18) may transmit the identification codes as part of tire pressure signal (20), or as a separate signal (not shown). In such a fashion, controller (24) disregards any tire pressure signals which may be transmitted from any nearby vehicle and received by receiver (22).

Each tire monitor (16) still further includes a magnetic switch (26), which preferably takes the form of a magnetic reed switch, although any other type of magnetic switch known in the art could be used. In each tire monitor (16), magnetic switch (26) is provided in communication with transmitter (18). Each tire monitor (16) is also associated with an electromagnet (32). In that regard, each electromagnet is mounted on the vehicle proximate one of the tire locations, such as in a vehicle wheel well (not shown). The plurality of electromagnets (32) are provided in communication with controller (24). As will be described in greater detail below, in response to control signals (not shown) from controller (24), each electromagnet (32) generates a magnetic field (not shown) which, in turn, cause the magnetic switch (26) of the associated tire monitor (16) to actuate the associated transmitter (18) to transmit a tire pressure signal (20).

Each tire monitor (16) may also be provided with a rotation sensor (28) for use in determining if the vehicle is stationary by sensing whether or not the associated tire (14) is rotating. In that regard, such a rotation sensor (28) may be provided in communication with the associated transmitter (18), and transmitter (18) may be configured to transmit a tire pressure signal only when the vehicle is in motion (i.e., when rotation sensor (28) provides an indication to transmitter (18) that tire (14) is rotating). The system (10) may further include a display unit (30) for mounting inside the vehicle, the display unit (30) for use by the controller (24) in conveying information, such as at least tire pressure and location, to the vehicle operator.

According to the system (10) of the present invention, at vehicle start-up and/or when the vehicle is placed in any forward or a reverse gear, controller (24) generates control signals (not shown) for sequentially energizing each of the plurality electromagnets (32) in a preselected or predetermined manner. Such energization causes the electromagnet (32) to generate a magnetic field (not shown). In turn, such a magnetic field causes magnetic switch (26) of the associated tire monitor (16) to actuate the associated transmitter (18) to transmit a tire pressure signal (20).

More particularly, controller (24) preferably selectively energizes and de-energizes each electromagnet (32). In that regard, when seeking tire pressure information from the Front Left (FL) tire (14), controller (24) energizes the electromagnet (32) associated with the FL tire location. As a result, in the manner described in detail above, receiver (22) receives a tire pressure signal (20) from transmitter (18) associated with tire monitor (16) associated with LF tire (14). A similar process is performed for each tire location (e.g., front right (FR), rear right (RR), and rear left (RL)).

Controller (24), which preferably takes the form of an appropriately programmed microprocessor or DSP, can be programmed to perform such polling in any fashion. That is, such polling could be undertaken continuously or periodically while the vehicle is in motion, or, as noted above, once at every ignition cycle and/or when the vehicle (12) is placed in any forward gear or a reverse gear.

As previously described, each pressure sensor (17) and/or transmitter (18) has a unique identification code associated therewith, which identification code is transmitted with the tire pressure signal (20). As a result, after selectively activating transmitters (18) in the fashion described above, controller (24) can associated each unique identification code with a particular tire location (e.g., front left (FL), front right (FR), rear left (RL), rear right (RR). Thereafter, controller (24) can correctly identify a tire location associated with any tire pressure signal (20) received, even where transmitters (18) transmit tire pressure signals (20) independently (i.e., without the need for activation by electromagnets (32) and magnetic switches (26)). Moreover, controller (24) can also subsequently verify correct tire location information by again selectively activating transmitters (18) using electromagnets (32) and magnetic switches (26) to confirm that the tire pressure signals (20) received at controller (24) have the identification codes expected. Such verification could be done, as noted above, at any time, such as at vehicle start-up, when the vehicle is placed in a forward or a reverse gear, or periodically when the vehicle (12) is in motion. It should also be noted that transmitters (18) may be configured to transmit tire pressure signals (20) only in response to activation by electromagnets (32) and magnetic switches (26) or, preferably, to also transmit tire pressure signals (20) independently, according to any desired schedule.

Figure 2:
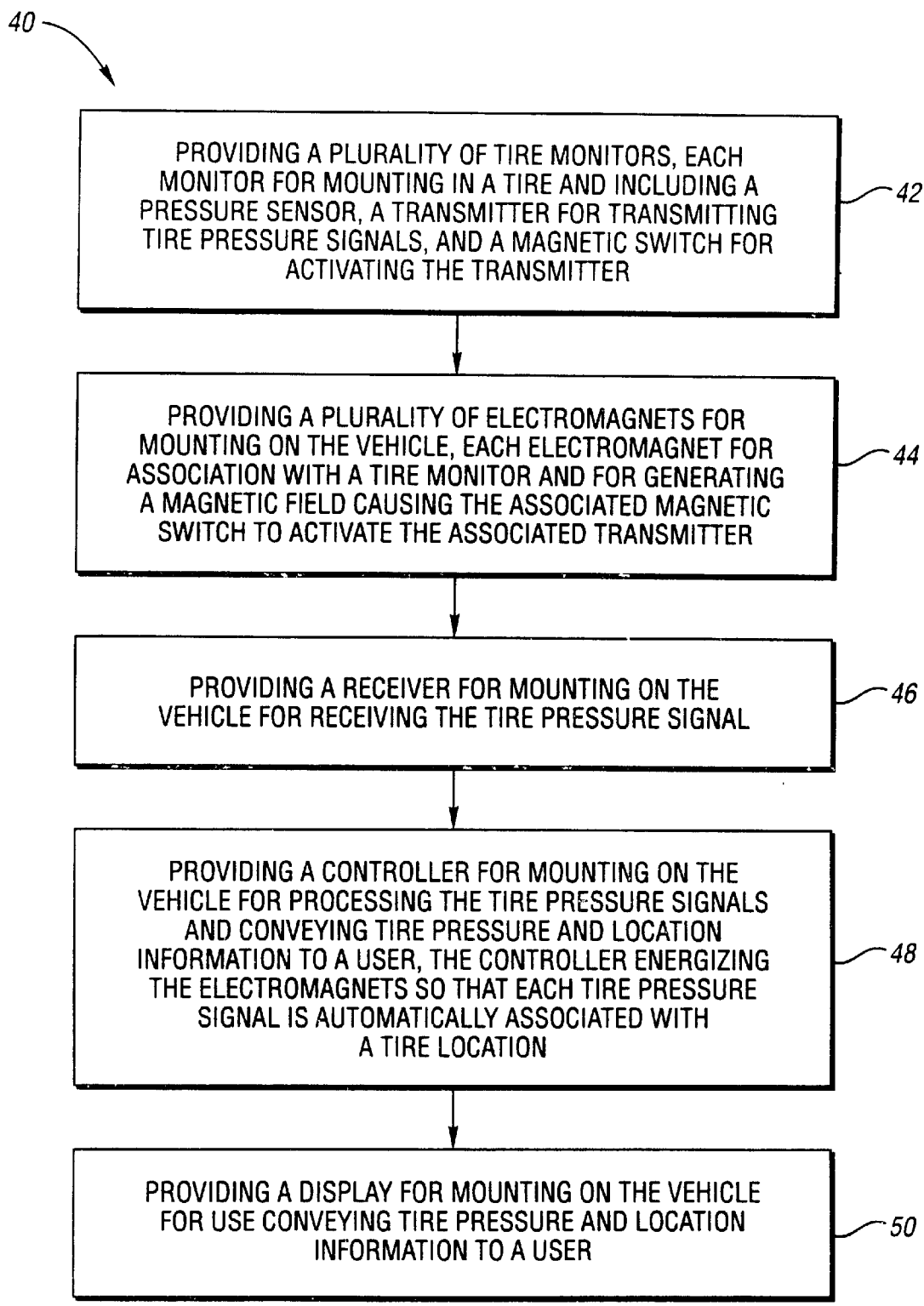
FIG. 2 is a simplified, representative flowchart of the method of the present invention for automatically identifying tire location in a tire pressure monitoring system.

Referring next to FIG. 2, a simplified, representative flowchart of the method of the present invention for automatically identifying tire location in a tire pressure monitoring system is shown, denoted generally by reference numeral 40. The method (40) is for use in a system for remote monitoring of tire pressure in a vehicle having a plurality of tires, each tire having a location. As seen in FIG. 2, the method (40) comprises providing (42) a plurality of tire monitors, each monitor for mounting in one of the plurality of tires, each monitor comprising a sensor for sensing tire pressure, a transmitter for transmitting a signal representative of the sensed tire pressure, and a magnetic switch for actuating the transmitter to transmit a tire pressure signal.

The method (40) further comprises providing (44) a plurality of electromagnets, each electromagnet for mounting on-board the vehicle in proximity to one of the plurality of tires for association with one of the plurality of tire monitors, each electromagnet for generating a magnetic field causing the magnetic switch of the associated tire monitor to actuate the transmitter of the associated tire monitor to transmit a tire pressure signal. The method (40) of the present invention may further comprises providing (46) a receiver for mounting on-board the vehicle for receiving the tire pressure signals transmitted by the transmitters.

The method (40) still further comprises providing (46) a controller for mounting on-board the vehicle, the controller to be provided in communication with the plurality of electromagnets, the controller for processing tire pressure signals received from the transmitters and for use in conveying tire pressure and location information to a user. The controller automatically energizes the plurality of electromagnets so that each received tire pressure signal is automatically associated with one of the plurality of tire locations as described in detail above.

The method (40) may further comprise providing (50) a display for mounting in the vehicle, the display for use by the controller to covey tire pressure and location information to a user.

It should be noted that the simplified flowchart depicted in FIG. 2 is exemplary of the method (40) of the present invention. In that regard, the method (40) may be executed in sequences other than those shown in FIG. 2, including the execution of a subset of the steps shown and/or the execution of one or more steps simultaneously.

As described in greater detail above, and with continuing reference to FIG. 1, according to the method (40) of the present invention, controller (24) preferably selectively energizes and de-energizes each electromagnet (32). In that regard, when seeking tire pressure information from the Front Left (FL) tire (14), controller (24) energizes the electromagnet (32) associated with the FL tire location. As a result, in the manner described in detail above, receiver (22) receives a tire pressure signal (20) from transmitter (18) associated with tire monitor (16) associated with LF tire (14). A similar process is performed for each tire location (e.g., front right (FR), rear right (RR), and rear left (RL)). Controller (24) can be programmed to perform such polling in any fashion, such as continuously or periodically while the vehicle is in motion, or once at every ignition cycle and/or when the vehicle (12) is placed in any forward gear or a reverse gear.

As also described in greater detail above, according to the method (40), each pressure sensor (17) and/or transmitter (18) has a unique identification code associated therewith, which identification code is transmitted with the tire pressure signal (20). As a result, after selectively activating transmitters (18) in the fashion described above, controller (24) can associated each unique identification code with a particular tire location (e.g., front left (FL), front right (FR), rear left (RL), rear right (RR). Thereafter, controller (24) can correctly identify a tire location associated with any tire pressure signal (20) received, even where transmitters (18) transmit tire pressure signals (20) independently (i.e., without the need for activation by electromagnets (32) and magnetic switches (26)).

Moreover, controller (24) can also subsequently verify correct tire location information by again selectively activating transmitters (18) using electromagnets (32) and magnetic switches (26) to confirm that the tire pressure signals (20) received at controller (24) have the identification codes expected. Such verification could be done, as noted above, at any time, such as at vehicle start-up, when the vehicle is placed in a forward or a reverse gear, or periodically when the vehicle (12) is in motion. It should also be noted that transmitters (18) may be configured to transmit tire pressure signals (20) only in response to activation by electromagnets (32) and magnetic switches (26) or, preferably, to also transmit tire pressure signals (20) independently, according to any desired schedule.

As noted above, after programming, current tire pressure monitoring systems show a vehicle operator which tire is outside appropriate operating parameters by displaying, preferably on an instrument panel, the particular location of that tire. This means, however, that the monitoring system has been appropriately programmed to properly indicate the correct location. As is readily apparent, the present invention overcomes this problem. That is, according to the present invention, the correct tire and tire location will always be identified automatically, without the need for programming the tire pressure monitoring system, or for re-programming of the system after tires are rotated or replaced.

From the foregoing description, it can be seen that the present invention provides an improved system and method for identifying tire locations in a tire pressure monitoring system. The system and method of the present invention provide for automatic recognition of tire location even after tire rotation, without the need for subsequent initialization or sign-up operations. The system and method of the present invention also do so easily and simply, without adding significant costs to the tire pressure monitoring system.

While various embodiments of the invention have been illustrated and described, it is not intended that these embodiments illustrate and describe all possible forms of the present invention. Rather, the words used in the specification are words of description rather than limitation, and it is understood that various changes may be made without departing from the spirit and scope of the invention. Indeed, many alternatives, modifications, and variations will be apparent to those skilled in the art in light of the foregoing description, and the present invention is intended to embrace all such alternatives.

What is claimed is:

1. In a system for remote monitoring of tire pressure in a vehicle having a plurality of tires, each tire having a location, a system for automatically identifying tire location comprising:

a plurality of tire monitors, each monitor for mounting in one of the plurality of tires, each monitor comprising a sensor for sensing tire pressure, a transmitter for transmitting a signal representative of the sensed tire pressure, and a magnetic switch for actuating the transmitter to transmit a tire pressure signal;

a plurality of electromagnets, each electromagnet for mounting on-board the vehicle in proximity to one of the plurality of tire locations for association with one of the plurality of tire monitors, each electromagnet for generating a magnetic field causing the magnetic switch of the associated tire monitor to actuate the transmitter of the associated tire monitor to transmit a tire pressure signal;

a receiver for mounting on-board the vehicle for receiving the tire pressure signals transmitted by the transmitters; and a controller for mounting on-board the vehicle, the controller to be provided in communication with the plurality of electromagnets and the receiver, the controller for processing tire pressure signals received by the receiver and for use in conveying tire pressure and location information to a user, wherein the controller energizes the plurality of electromagnets so that each received tire pressure signal is automatically associated with one of the plurality of tire locations.

2. The system of claim 1 wherein the controller automatically energizes each of the plurality of electromagnets in a predetermined sequence when the vehicle is started.

3. The system of claim 1 wherein the controller automatically energizes each of the plurality of electromagnets in a predetermined sequence when the vehicle is placed in a forward gear.

4. The system of claim 1 wherein the controller automatically energizes each of the plurality of electromagnets in a predetermined sequence when the vehicle is placed in a reverse gear.

5. The system of claim 1 wherein the controller automatically energizes each of the plurality of electromagnets in a predetermined sequence periodically while the vehicle is in motion.

6. The system of claim 1 wherein each of the transmitters transmits a tire pressure signal only in response to a magnetic field generated by the associated electromagnet.

7. The system of claim 1 wherein each tire monitor has an identification associated therewith, and each transmitter is also for transmitting the identification of the associated monitor for receipt by the receiver and for use by the controller in verifying a tire location.

8. The system of claim 7 wherein the transmitted identification is also for use by the controller in identifying the tire pressure signals as associated with the vehicle.

9. The system of claim 1 further comprising a display for mounting in the vehicle, the display for use by the controller to covey tire pressure and location information to a user.

10. The system of claim 1 wherein the magnetic switch comprises a magnetic reed switch.

11. In a system for remote monitoring of tire pressure in a vehicle having a plurality of tires, each tire having a location, a method for automatically identifying tire location comprising:

providing a plurality of tire monitors, each monitor for mounting in one of the plurality of tires, each monitor comprising a sensor for sensing tire pressure, a transmitter for transmitting a signal representative of the sensed tire pressure, and a magnetic switch for actuating the transmitter to transmit a tire pressure signal;

providing a plurality of electromagnets, each electromagnet for mounting on-board the vehicle in proximity to one of the plurality of tire locations for association with one of the plurality of tire monitors, each electromagnet for generating a magnetic field causing the magnetic switch of the associated tire monitor to actuate the transmitter of the associated tire monitor to transmit a tire pressure signal; and providing a controller for mounting on-board the vehicle, the controller to be provided in communication with the plurality of electromagnets, the controller for processing tire pressure signals from the transmitters and for use in conveying tire pressure and location information to a user, wherein the controller energizes the plurality of electromagnets so that each tire pressure signal is automatically associated with one of the plurality of tire locations.

12. The method of claim 11 wherein the controller automatically energizes each of the plurality of electromagnets in a predetermined sequence when the vehicle is started.

13. The method of claim 11 wherein the controller automatically energizes each of the plurality of electromagnets in a predetermined sequence when the vehicle is placed in a forward gear.

14. The method of claim 11 wherein the controller automatically energizes each of the plurality of electromagnets in a predetermined sequence when the vehicle is placed in a reverse gear.

15. The method of claim 11 wherein the controller automatically energizes each of the plurality of electromagnets in a predetermined sequence periodically while the vehicle is in motion.

16. The method of claim 11 wherein each of the transmitters transmits a tire pressure signal only in response to a magnetic field generated by the associated electromagnet.

17. The method of claim 11 wherein each tire monitor has an identification associated therewith, and each transmitter is also for transmitting the identification of the associated monitor for receipt by the receiver and for use by the controller in confirming a tire location.

18. The method of claim 17 wherein the transmitted identification is also for use by the controller in identifying the tire pressure signals as associated with the vehicle.

19. The method of claim 11 further comprising a providing display for mounting in the vehicle, the display for use by the controller to covey tire pressure and location information to a user.

20. The method of claim 11 wherein the magnetic switch comprises a magnetic reed switch.

* * * * *